United States Patent
Sekine et al.

(10) Patent No.: US 10,483,307 B2
(45) Date of Patent: Nov. 19, 2019

(54) IMAGING DEVICE

(71) Applicant: CANON KABUSHIKI KAISHA, Tokyo (JP)

(72) Inventors: Hiroshi Sekine, Kawagoe (JP); Yusuke Onuki, Fujisawa (JP); Masahiro Kobayashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/791,909

(22) Filed: Oct. 24, 2017

(65) Prior Publication Data

US 2018/0151616 A1 May 31, 2018

(30) Foreign Application Priority Data

Nov. 30, 2016 (JP) .................................. 2016-232726

(51) Int. Cl.
*H04N 3/14* (2006.01)
*H04N 5/335* (2011.01)
(Continued)

(52) U.S. Cl.
CPC ........ *H01L 27/14623* (2013.01); *G06T 7/571* (2017.01); *H01L 27/1463* (2013.01);
(Continued)

(58) Field of Classification Search
CPC ...... H04N 5/361; H04N 5/3577; H04N 5/363; H04N 5/359; H01L 27/14609; H01L 27/14623
See application file for complete search history.

(56) References Cited

U.S. PATENT DOCUMENTS 7,462,810 B2 12/2008 Kobayashi
7,928,477 B2  4/2011 Kobayashi
(Continued)

FOREIGN PATENT DOCUMENTS

JP  2009-272374  11/2009
JP  2011-204878  10/2011

OTHER PUBLICATIONS

U.S. Appl. No. 15/631,391, filed Jun. 23, 2017, by Hiromasa Tsuboi et al.
(Continued)

*Primary Examiner* — Kelly L Jerabek
(74) *Attorney, Agent, or Firm* — Venable LLP

(57) ABSTRACT

Provided is an imaging device including a substrate; a pixel array in which pixels are arranged in a two-dimensional manner on the substrate, each pixel including a photoelectric conversion unit that accumulates charges generated from an incident light, a charge holding unit that holds the charges transferred from the photoelectric conversion unit, and an amplification unit that receives the charges transferred from the charge holding unit; and a light-shielding portion arranged to cover at least the charge holding unit. The photoelectric conversion unit and the charge holding unit in each pixel are aligned in a first direction in a top view orthogonal to the substrate. The charge holding units of the neighboring pixels are aligned in a second direction intersecting the first direction in the top view. The light-shielding portion extends in the second direction and over the charge holding units, and covers a region between the charge holding units.

19 Claims, 9 Drawing Sheets

(51) Int. Cl.
 *H01L 27/146* (2006.01)
 *G06T 7/571* (2017.01)
 *H04N 5/3745* (2011.01)

(52) U.S. Cl.
 CPC ... *H01L 27/14603* (2013.01); *H04N 5/37452* (2013.01); *H04N 5/37457* (2013.01)

(56) References Cited

U.S. PATENT DOCUMENTS

| | | | |
|---|---|---|---|
| 7,935,995 B2 | 5/2011 | Watanabe | |
| 8,045,034 B2 | 10/2011 | Shibata | |
| 8,063,351 B2 | 11/2011 | Kobayashi | |
| 8,115,848 B2 | 2/2012 | Onuki | |
| 8,174,604 B2 | 5/2012 | Shibata | |
| 8,222,682 B2 | 7/2012 | Watanabe | |
| 8,259,206 B1 | 9/2012 | Shibata | |
| 8,289,432 B2 | 10/2012 | Shibata | |
| 8,357,956 B2 | 1/2013 | Kobayashi | |
| 8,427,564 B2 | 4/2013 | Yamashita | |
| 8,441,564 B2 | 5/2013 | Yamashita | |
| 8,456,559 B2 | 6/2013 | Yamashita | |
| 8,552,353 B2 | 10/2013 | Kobayashi | |
| 8,625,011 B2 | 1/2014 | Machida | |
| 8,723,232 B2 | 5/2014 | Kobayashi | |
| 8,736,734 B2 | 5/2014 | Onuki | |
| 8,884,391 B2 | 11/2014 | Fudaba | |
| 9,147,708 B2 | 9/2015 | Okita | |
| 9,153,610 B2 | 10/2015 | Kobayashi | |
| 9,276,027 B2 | 3/2016 | Okita | |
| 9,344,653 B2 | 5/2016 | Shimotsusa | |
| 9,419,038 B2 | 8/2016 | Kobayashi | |
| 9,445,026 B2 | 9/2016 | Kobayashi | |
| 9,538,112 B2 | 1/2017 | Wada | |
| 9,548,328 B2 | 1/2017 | Hasegawa | |
| 9,716,849 B2 | 7/2017 | Kobayashi | |
| 9,768,213 B2 | 9/2017 | Soda | |
| 9,818,794 B2 | 11/2017 | Okita | |
| 2012/0193692 A1* | 8/2012 | Kawahito | H01L 27/14609 257/292 |
| 2013/0206965 A1 | 8/2013 | Yamashita | |
| 2014/0061436 A1 | 3/2014 | Kobayashi | |
| 2014/0239155 A1* | 8/2014 | Ohkubo | H01L 27/14603 250/208.1 |
| 2015/0264283 A1* | 9/2015 | Kobayashi | H04N 5/361 257/229 |
| 2015/0281614 A1 | 10/2015 | Yoshida | |
| 2016/0227139 A1 | 8/2016 | Shimotsusa | |
| 2016/0322406 A1 | 11/2016 | Kobayashi | |
| 2017/0078557 A1 | 3/2017 | Kawabata | |
| 2017/0078594 A1 | 3/2017 | Kawabata | |
| 2017/0078604 A1 | 3/2017 | Kobayashi | |
| 2017/0289478 A1 | 10/2017 | Kobayashi | |
| 2017/0294470 A1 | 10/2017 | Takami | |

OTHER PUBLICATIONS

U.S. Appl. No. 15/584,718, filed May 2, 2017, by Masahiro Kobayashi et al.
U.S. Appl. No. 15/594,259, filed May 12, 2017, by Masahiro Kobayahsi et al.
U.S. Appl. No. 15/601,620, filed May 22, 2017, by Kazunari Kawabata et al.

* cited by examiner

IMAGING DEVICE

BACKGROUND OF THE INVENTION

Field of the Invention

The present invention relates to an imaging device.

Description of the Related Art

In recent years, CMOS image sensors that allow for low power consumption and fast readout are widely used as an imaging device for an imaging system such as a digital still camera, a digital video camera, or the like. As a readout method in the imaging device, global electronic shutter has been proposed in which the start time and the end time of charge accumulation are common to all the pixels.

Within each pixel of an imaging device disclosed in Japanese Patent Application Laid-Open No. 2009-272374, in addition to photoelectric conversion units that perform photoelectric conversion, charge holding units that hold charges generated by the photoelectric conversion unit for a predetermined period are provided in order to implement a function of global electronic shutter. When a light enters the charge holding unit, charges photoelectrically converted by the charge holding unit form a false signal, which may cause deterioration of the image quality. Thus, a light-shielding portion covering the charge holding units is provided in the imaging device of Japanese Patent Application Laid-Open No. 2009-272374.

In the art of Japanese Patent Application Laid-Open No. 2009-272374, a plurality of edges of openings of the light-shielding portion are arranged near ends of the charge holding units in a top view, which may result in insufficient shield of a light. Therefore, a light entering the charge holding unit may cause a false signal resulting in deterioration of the image quality.

SUMMARY OF THE INVENTION

The present invention intends to provide an imaging device in which deterioration of the image quality due to a false signal is reduced.

According to one embodiment of the present invention, provided is an imaging device including a substrate; a pixel array in which a plurality of pixels are arranged in a two-dimensional manner on the substrate, in which each of the pixels includes a photoelectric conversion unit configured to accumulate charges generated from an incident light, a charge holding unit configured to hold the charges transferred from the photoelectric conversion unit, and an amplification unit having an input node that receives the charges transferred from the charge holding unit; and a light-shielding portion arranged to cover at least the charge holding unit. The photoelectric conversion unit and the charge holding unit included in one of the pixels are aligned in a first direction in a top view from a direction orthogonal to the substrate. A plurality of the charge holding units of the plurality of the pixels that are adjacent to each other are aligned in a second direction intersecting the first direction in the top view. The light-shielding portion extends in the second direction and over the plurality of the charge holding units, and covers a region between the plurality of the charge holding units.

According to the present invention, an imaging device in which deterioration of the image quality due to a false signal is reduced can be provided.

Further features of the present invention will become apparent from the following description of exemplary embodiments with reference to the attached drawings.

DESCRIPTION OF THE EMBODIMENTS

Figure 1:
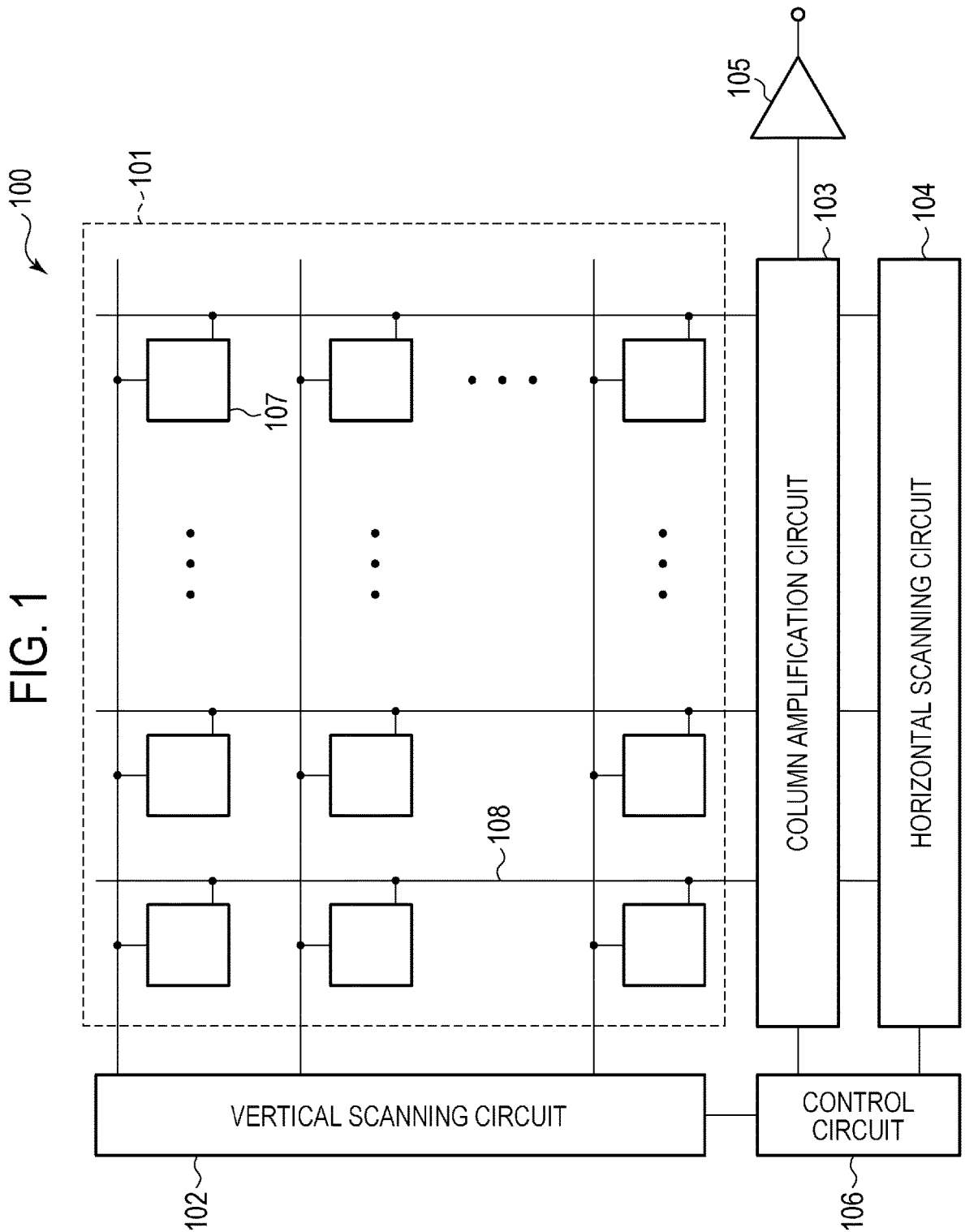
FIG. 1 is a block diagram of an imaging device according to a first embodiment of the present invention.

Preferred embodiments of the present invention will now be described in detail in accordance with the accompanying drawings. Components having the same function throughout a plurality of drawings are labeled with the same reference numeral, and the description thereof may be omitted or simplified.

First Embodiment

FIG. 1 is a block diagram illustrating a general configuration of an imaging device 100 according to the present embodiment. The imaging device 100 has a pixel array 101, a vertical scanning circuit 102, a column amplification circuit 103, a horizontal scanning circuit 104, an output circuit 105, and a control circuit 106. The imaging device 100 is a semiconductor device formed on a semiconductor substrate such as a silicon substrate and is a CMOS image sensor in the present embodiment. The pixel array 101 has a plurality of pixels 107 arranged in a two-dimensional manner including a plurality of rows and a plurality of columns on the semiconductor substrate. The vertical scanning circuit 102 supplies a plurality of control signals for controlling a plurality of transistors included in the pixel 107 to be turned on (conductive state) or turned off (non-conductive state). A column signal line 108 is provided on each column of the pixels 107, and signals from the pixels 107 are read out to the column signal lines 108 on a column basis. The column amplification circuit 103 amplifies pixel signals output to the column signal lines 108 and performs a process thereon such as correlated double sampling or the like based on signals at the time of reset and signals at the time of photoelectric conversion of the pixels 107. The horizontal scanning circuit 104 has switches connected to amplifiers of the column amplification circuit 103 and supplies control signals to control the switches to be on or off. The control circuit 106 controls the vertical scanning circuit 102, the column amplification circuit 103, and the horizontal scanning circuit 104. The output circuit 105 includes a buffer amplifier, a differential amplifier, or the like and outputs a pixel signal from the column amplification circuit 103 to a signal processing unit outside the imaging device 100. Further, an analog-to-digital (AD) conversion unit may be provided to the imaging device 100, and thereby the imaging device 100 may be configured to output a digital pixel signal.

Figure 2:
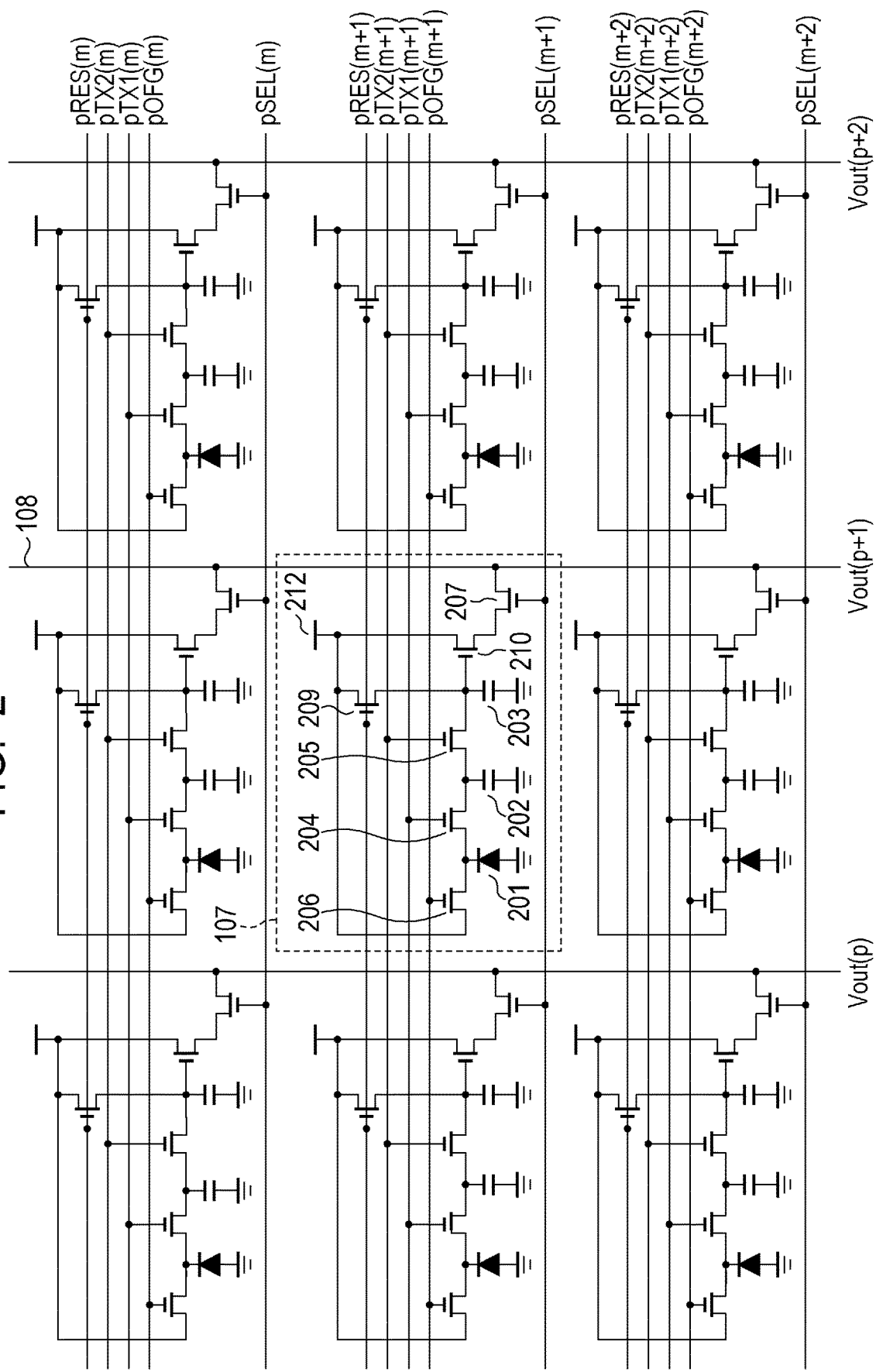
FIG. 2 is an equivalent circuit diagram of pixels in the imaging device according to the first embodiment of the present invention.

FIG. 2 is a diagram illustrating an equivalent circuit of the pixels 107 of the imaging device 100 according to the present embodiment. FIG. 2 illustrates nine pixels 107 of three rows by three columns out of the plurality of pixels 107 two-dimensionally aligned in the row direction and the column direction. However, this is a mere example illustrating a part of the plurality of pixels 107, and the imaging device 100 may have more pixels. Each pixel 107 includes a photoelectric conversion unit 201, a charge holding unit 202, a first transfer transistor 204, a second transfer transistor 205, and an overflow transistor 206. Further, each pixel 107 includes a reset transistor 209, an amplification transistor 210, and a selection transistor 207. Each of the first transfer transistor 204, the second transfer transistor 205, the overflow transistor 206, the selection transistor 207, a reset transistor 209, and an amplification transistor 210 may be formed of a MOS transistor. Each control signal that controls each of these transistors is input to the gate of each transistor from the vertical scanning circuit 102 via a control line. While one of the pixels 107 at (m+1)th row and (p+1)th column will be focused on for description, other pixels 107 may have the same configuration.

The photoelectric conversion unit 201 photoelectrically converts an incident light and accumulates signal charges generated by the photoelectric conversion. The first transfer transistor 204 is controlled by a control signal pTX1(m+1) input to the gate thereof and, when turned on, transfers charges of the photoelectric conversion unit 201 to the charge holding unit 202. The charge holding unit 202 holds charges transferred from the photoelectric conversion unit 201. The second transfer transistor 205 is controlled by a control signal pTX2(m+1) input to the gate thereof and, when turned on, transfers charges of the charge holding unit 202 to a floating diffusion portion 203 that is an input node of the amplification transistor 210. That is, the amplification transistor 210 that functions as an amplification unit includes the floating diffusion portion 203 that functions as an input node that receives charges transferred from the charge holding unit.

The drain of the amplification transistor 210 is connected to the power source voltage line 212, and the source of the amplification transistor 210 is connected to the drain of the selection transistor 207. The source of the selection transistor 207 is connected to the column signal line 108. The column signal line 108 is connected with a constant current source (not illustrated). The selection transistor 207 is controlled by a control signal pSEL(m+1) input to the gate thereof and, when turned on, causes the source of the amplification transistor 210 to be connected to the column signal line 108 to function as a source follower. At this time, the output signal Vout(p+1) based on a voltage of the floating diffusion portion 203 is output to the column amplification circuit 103 via the column signal line 108 on each column.

The reset transistor 209 is controlled by a control signal pRES(m+1) input to the gate thereof and, when turned on, resets the voltage of the floating diffusion portion 203. The source of the overflow transistor 206 is connected to the photoelectric conversion unit 201. The drain of the overflow transistor 206 is connected to a node such as an overflow drain having a power source voltage and depicted as being connected to the power source voltage line 212 in an equivalent manner in FIG. 2. The overflow transistor 206 is controlled by a control signal pOFG(m+1) input to the gate thereof and, when turned on, causes charges accumulated in the photoelectric conversion unit 201 to be drained to the power source voltage line 212 or the like.

Figure 3A:
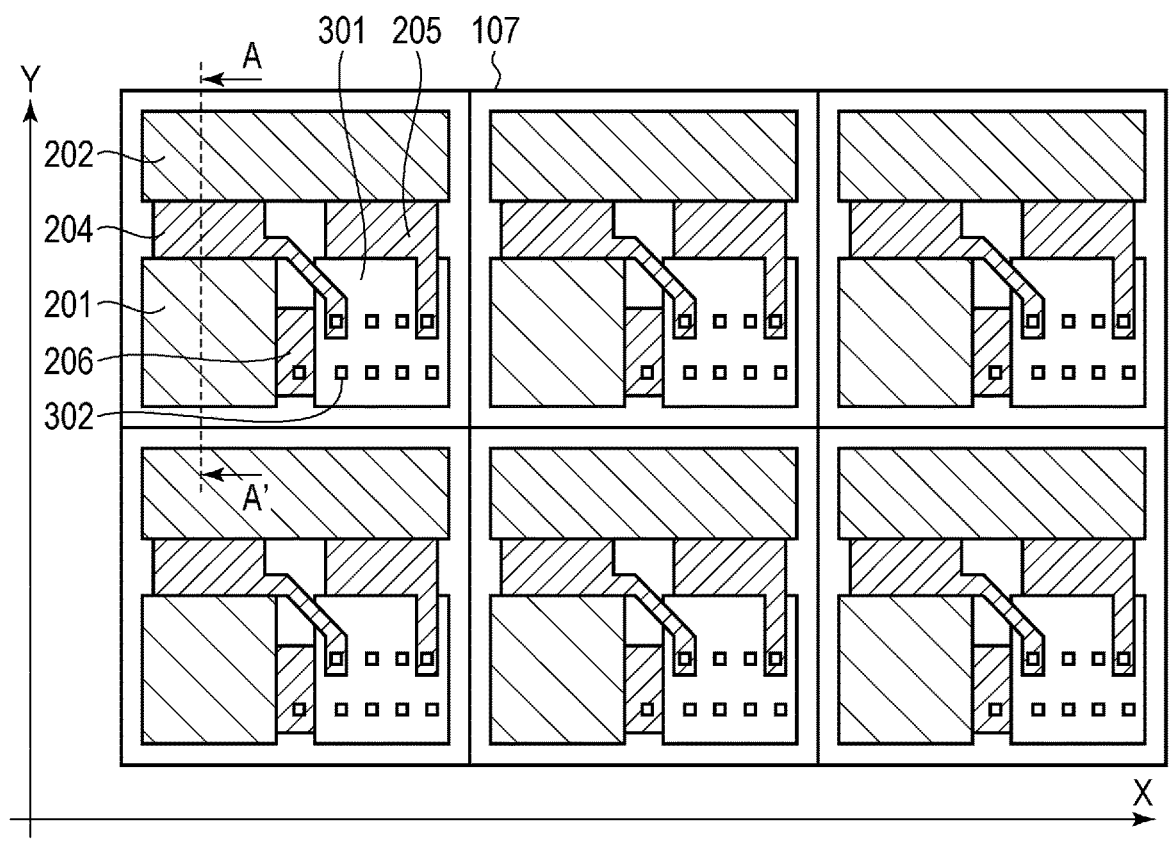
FIG. 3A and FIG. 3B are plan views of the pixels in the imaging device according to the first embodiment of the present invention.
Figure 3B:
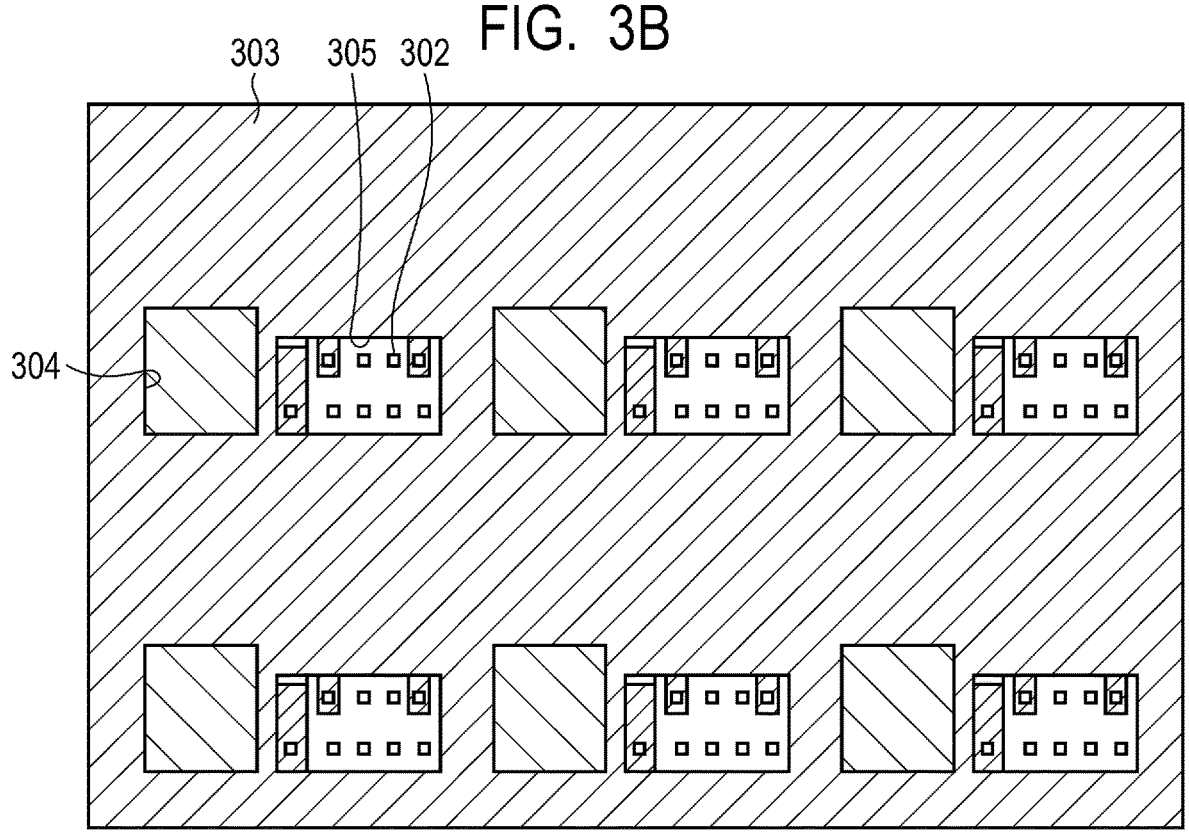

FIG. 3A and FIG. 3B are plan views of the pixels 107 of the imaging device 100 according to the present embodiment. FIG. 3A is a plan view schematically illustrating a pattern around a semiconductor substrate surface in a top view from a direction orthogonal to the semiconductor substrate, and FIG. 3B is a plan view mainly, schematically illustrating a pattern of a light-shielding portion 303 formed above the semiconductor substrate. In FIG. 3A, portions having the same function as those in FIG. 1 and FIG. 2 are labeled with the same reference numeral, and the description of the function thereof will be omitted. A readout circuit unit 301 in FIG. 3A is illustrated as one block including the selection transistor 207, the reset transistor 209, and the amplification transistor 210. That is, the readout circuit unit 301 is a group of circuits used for reading out charges generated by the photoelectric conversion unit 201 as an electrical signal. Further, the readout circuit unit 301 includes a semiconductor region forming an overflow drain and a semiconductor region forming the floating diffusion portion 203. The semiconductor region forming the overflow drain is arranged adjacent to the gate electrode of the overflow transistor 206. The semiconductor region forming the floating diffusion portion 203 is arranged adjacent to the gate electrode of the second transfer transistor 205. Further, the pixel 107 has a plurality of contacts 302 that connect an impurity diffusion layer, electrodes such as a gate electrode, or the like provided on the semiconductor substrate to a wiring layer formed above the semiconductor substrate.

In each pixel 107 illustrated in FIG. 3A, the photoelectric conversion unit 201 and the readout circuit unit 301 are arranged so as to be aligned in an X-direction (second direction) interposing the gate electrode of the overflow transistor 206. Further, the photoelectric conversion unit 201 and the charge holding unit 202 are arranged so as to be aligned in a Y-direction (first direction), which intersects the X-direction, interposing the gate electrode of the first transfer transistor 204. In the present embodiment, the X-direction and the Y-direction are orthogonal to each other. Further, the charge holding unit 202 and the readout circuit unit 301 are arranged so as to be aligned in the Y-direction interposing the gate electrode of the second transfer transistor 205. The same arrangement is provided in the adjacent pixel 107, and thus the charge holding unit 202 of the adjacent pixel 107 is arranged so as to be aligned in the X-direction. The plurality of contacts 302 are arranged in or near the region in which the readout circuit unit 301 is arranged. More specifically, the plurality of contacts 302 are formed in regions except the regions between the plurality of charge holding units 202 aligned in the X-direction. Further, the gap of the two charge holding units 202 of the plurality of charge holding units 202 which are adjacent to each other is smaller than the width of the gate electrode of the first transfer transistor 204. Here, the width of the gate electrode corresponds to the length in a channel direction of the first transfer transistor 204.

FIG. 3B illustrates a pattern of the light-shielding portion 303 arranged so as to cover at least charge holding units 202. The light-shielding portion 303 has openings 304 (first opening) formed in the regions in which the photoelectric conversion units 201 are formed in a top view. Furthermore, the light-shielding portion 303 has openings 305 (second opening) formed in the regions between the photoelectric conversion units 201 of the plurality of adjacent pixels 107 and in which the readout circuit units 301 are formed. That is, in the present embodiment, the light-shielding portion 303 is arranged so as to cover the entire surface of the pixels 107 except the openings 304 and the openings 305. FIG. 3B illustrates six pixels arranged in a matrix of two rows by three columns. Preferably, the same alignment is repeated over the entire pixel array. In this case, it is preferable that the alignment be continuous from one end to the other end of the pixel array so as to cover a plurality of charge holding units 202 forming one row in the X-direction. The light-shielding unit 303 is a layer formed above the semiconductor substrate via an insulating layer (not illustrated) and is made of a material which is less likely to transmit a light. A tungsten is used for the light-shielding portion 303. A metal such as an aluminum, a copper, or the like may be used for the light-shielding portion 303 other than the above.

The reason why the opening 305 is provided above the readout circuit unit 301 is to avoid conduction between the contact 302 and the light-shielding portion 303. Therefore, the shape of the opening 305 may be any shape as long as it is not conducted with the contact 302, and the positional relationship with respect to the readout circuit unit 301 is not limited. For example, the opening 305 may be arranged so as to cover at least a part of the readout circuit unit 301 where no contact 302 is provided in a top view. Further, the opening 305 may be arranged so as to open a region including a portion around the readout circuit unit 301.

The reason why the opening 304 is provided above the photoelectric conversion unit 201 of the readout circuit unit 301 is to allow a light to enter the photoelectric conversion unit 201. Note that the light-shielding portion 303 is provided above the charge holding unit 202 in order to reduce occurrence of a false signal and thus the charge holding unit 202 is shielded from a light. It is desirable to shield a region above a portion around the charge holding unit 202 from a light as much as possible in order to reduce an influence due to a false signal that may occur when an oblique incident light or the like leaks to the charge holding unit 202. Therefore, it is desirable that the end of the opening 304 of the light-shielding portion 303 be arranged distant from the charge holding unit 202 as much as possible.

As discussed above, in the present embodiment, the light conversion unit 201 and the readout circuit unit 301 are arranged in positions where the charge holding unit 202 is moved in parallel to the Y-direction. However, in a position where the charge holding unit 202 is moved in parallel to the X-direction, the charge holding unit 202 of the adjacent pixel is arranged, and none of the photoelectric conversion unit 201, the readout circuit unit 301, and the contacts 302 is arranged. Therefore, while the plurality of openings 304 and 305 of the light-shielding portion 303 are arranged in positions where the charge holding units 202 are moved in parallel to the Y-direction, none of the plurality of openings 304 and 305 of the light-shielding portion 303 is arranged in a position where the charge holding units 202 are moved in parallel to the X-direction. In other words, the light-shielding portion 303 extends across the plurality of charge holding units 202 in the X-direction so as to cover regions between the plurality of charge holding units 202 aligned in the X-direction in the top view.

In Japanese Patent Application Laid-Open No. 2009-272374, the opening edge of a light-shielding portion is arranged near the end of a charge holding unit in the top view. In this structure, when there is an incident light from an oblique direction or the like, a light may leak from the end of the opening to the charge holding unit, which may result in insufficient light-shielding. In contrast, in the present embodiment, regions between the plurality of charge holding units 202 aligned in the X-direction are covered by the light-shielding portion 303, and the plurality of openings 304 and 305 of the light-shielding portion 303 are arranged in positions where the charge holding units 202 are moved in parallel to the Y-direction. Thereby, since each end of the openings 304 and 305 of the light-shielding portion 303 can be located in a position more distant from each end of the charge holding units 202, the light-shielding property of the charge holding units 202 can be improved. Therefore, the imaging device 100 with further reduced deterioration of the image quality due to a false signal caused by a light entering the charge holding unit 202 can be provided.

Note that, in the present embodiment, the plurality of contacts 302 included in one of the pixels 107 are aggregated in corresponding one of the openings 305. As illustrated in FIG. 3B, it is desirable that the plurality of contacts 302 within the pixel 107 have the possible smallest gap between the contacts 302 and be arranged inside one of the openings 305 in the top view. This is because, if the plurality of contacts 302 were arranged within the pixel 107 in a scattered manner, this would lead to an increase in the number or the area of openings. With each of the openings 305 being formed in a region in which the plurality of contacts 302 are formed in the top view, the number or the area of openings can be minimized to improve the light-shielding property of the charge holding units 202. Thereby, the imaging device 100 with further reduced deterioration of the image quality due to a false signal can be provided.

Figure 4:
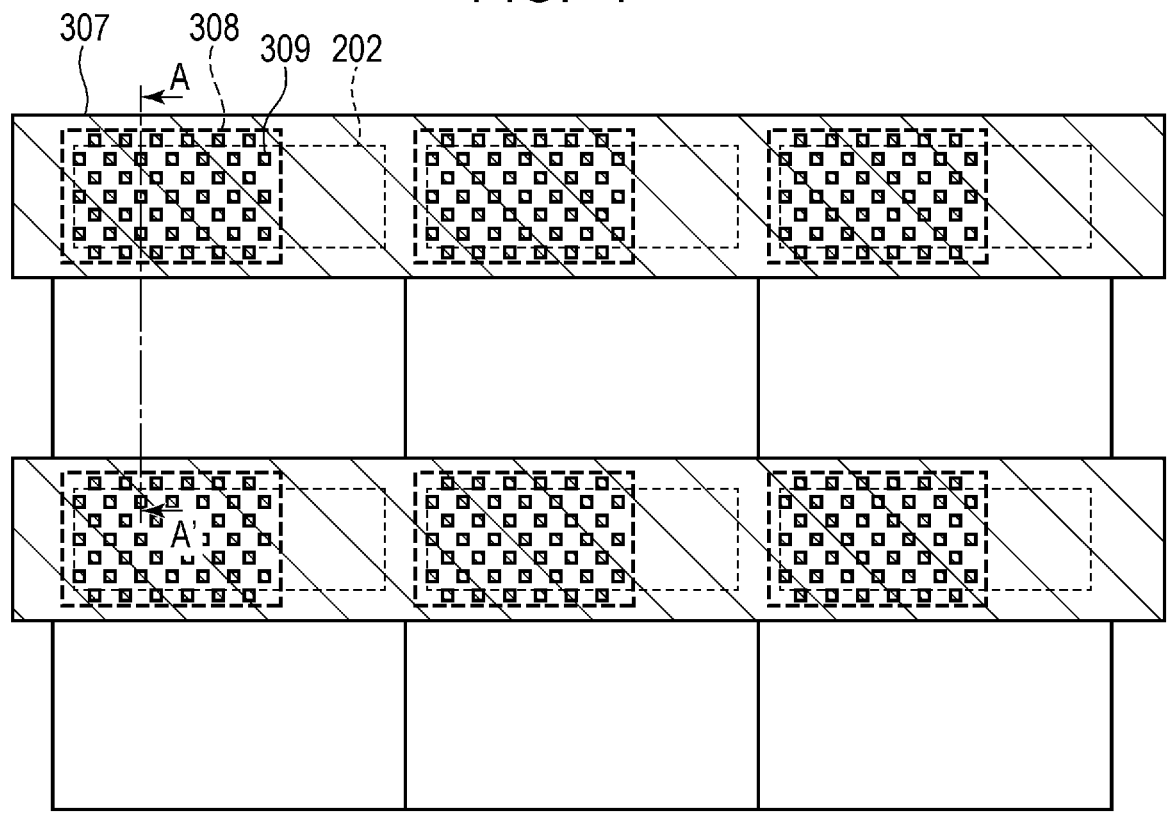
FIG. 4 is a plan view of pixels in the imaging device according to the first embodiment of the present invention.

FIG. 4 is a plan view mainly, schematically illustrating a pattern of a first wiring layer 307, a second wiring layer 308, and vias 309 formed over the semiconductor substrate. The first wiring layer 307 is arranged above the charge holding unit 202 via an interlayer insulating layer (not illustrated). Furthermore, the second wiring layer 308 is arranged above the first wiring layer 307 via an interlayer insulating layer (not illustrated). Between the first wiring layer 307 and the second wiring layer 308, a plurality of vias 309 electrically connecting these layers are arranged in a checkered pattern. The first wiring layer 307, the second wiring layer 308, and the vias 309 each have a conductivity and may be formed of a member such as a metal that is less likely to transmit a light.

Figure 5:
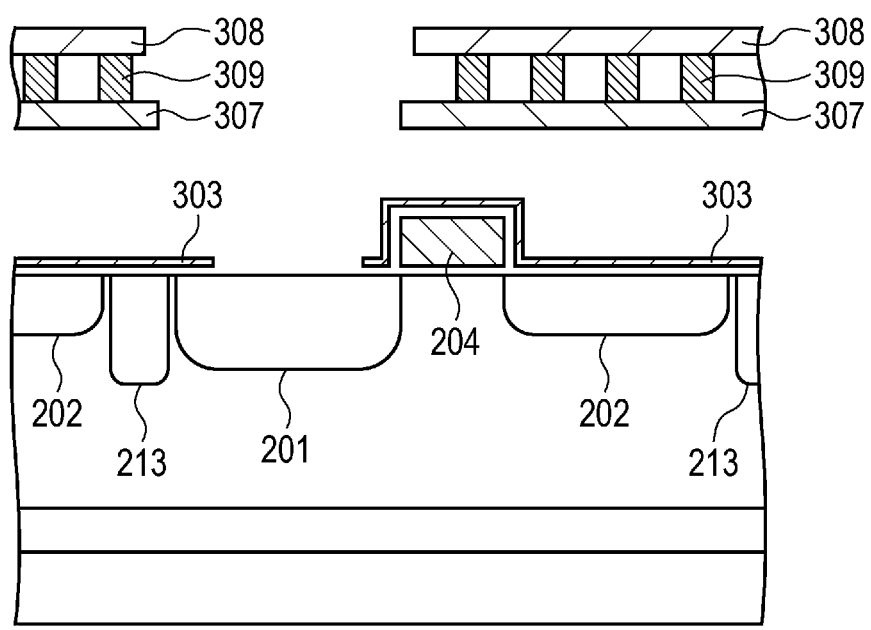
FIG. 5 is a sectional view of pixels in the imaging device according to the first embodiment of the present invention.

FIG. 5 is a diagram schematically illustrating the structure of a cross section taken along a line A-A' illustrated in FIG. 3A and FIG. 4. In a semiconductor substrate illustrated in FIG. 5, depicted are a semiconductor region forming the photoelectric conversion unit 201, semiconductor regions forming the charge holding units 202, and element isolation regions 213 electrically isolating the photoelectric conversion unit 201 from the charge holding unit 202. Further, on or over the semiconductor substrate, FIG. 5 depicts a gate electrode forming the first transfer transistor 204, the light-shielding portion 303, the first wiring layer 307, the second wiring layer 308, and the vias 309. In such a way, the first wiring layer 307, the second wiring layer 308, and the vias 309 may be arranged above the charge holding unit 202 so as to cover the charge holding unit 202. In this case, the first wiring layer 307, the second wiring layer 308, the vias 309 block a light, and an incidence of a light to the charge holding unit 202 can be further reduced. Therefore, the imaging device 100 with further reduced deterioration of the image quality due to a false signal can be provided.

For the specific structure of the element isolation region 213 arranged around the charge holding unit 202, isolation by Shallow Trench Isolation (STI), PN junction isolation, or the like may be used. It is here desirable that the material used for the element isolation region 213 be a material that restricts a light entering the charge holding unit 202. Specifically, it is desirable that the material used for the element isolation region 213 be a material having a low transmittance to a visible light. Since a semiconductor such as a silicon has a low transmittance to a visible light, it is desirable to arrange an impurity diffusion region forming PN junction isolation, that is, a semiconductor such as a silicon in the element isolation region 213, for example. In this case, a light that has entered the element isolation region 213 is attenuated before reaching the charge holding unit 202, and thus the amount of a light entering the charge holding unit 202 is reduced. Therefore, since an amount of a light incidence to the charge holding unit 202 is reduced compared to the case where element isolation structure such as isolation by STI using a material such as silicon oxide that is transparent to a visible light is employed, the imaging device 100 with further reduced deterioration of the image quality due to a false signal can be provided.

Further, the shape of the pixel array 101 may be a rectangle having shorter sides and longer sides. For example, when the number of rows N and the number of columns M of the pixels 107 included in the pixel array 101 are different from each other, the shape of the pixel array 101 can be a rectangle. Also, when the pixel 107 is rectangular, the shape of the pixel array 101 can be a rectangle. In this case, it is desirable that the X-direction illustrated in FIG. 3A in which the plurality of charge holding units 202 are aligned and the direction of longer sides of the pixel array 101 be parallel. An incident light emitted from a subject enters the pixel array 101 of the imaging device 100 via a lens included in an optical system of the imaging system such as a camera. In this case, since the end of the longer side of the pixel array 101 is in the most distant position from the center axis of the lens, an incident angle of an incident light to the pixel array 101 at the end of the longer side is the largest. When a light obliquely enters the openings 304 and 305 of the light-shielding portion 303 and the charge holding units 202 are arranged near a portion through which the incident light passes, deterioration of an image quality due to a false signal may occur. The larger the incident angle is, the more such a situation is likely to occur. Thus, around the end of the longer side where an incident light is the largest, it is preferable that the charge holding units 202 be not arranged on the extension of an oblique incident light from the openings 304 and 305 of the light-shielding portion 303. In order to realize this arrangement, the X-direction in which the charge holding units 202 are aligned and the direction of the longer sides of the pixel array 101 are preferably parallel. Because of the above reasons, with the longer side direction of the pixel array 101 being parallel to the X-direction in which the plurality of charge holding units 202 are aligned, a light incidence to the charge holding units 202 near the end of the pixel array 101 can be reduced. Therefore, the imaging device 100 with further reduced deterioration of the image quality due to a false signal can be provided.

Second Embodiment

Figure 6A:
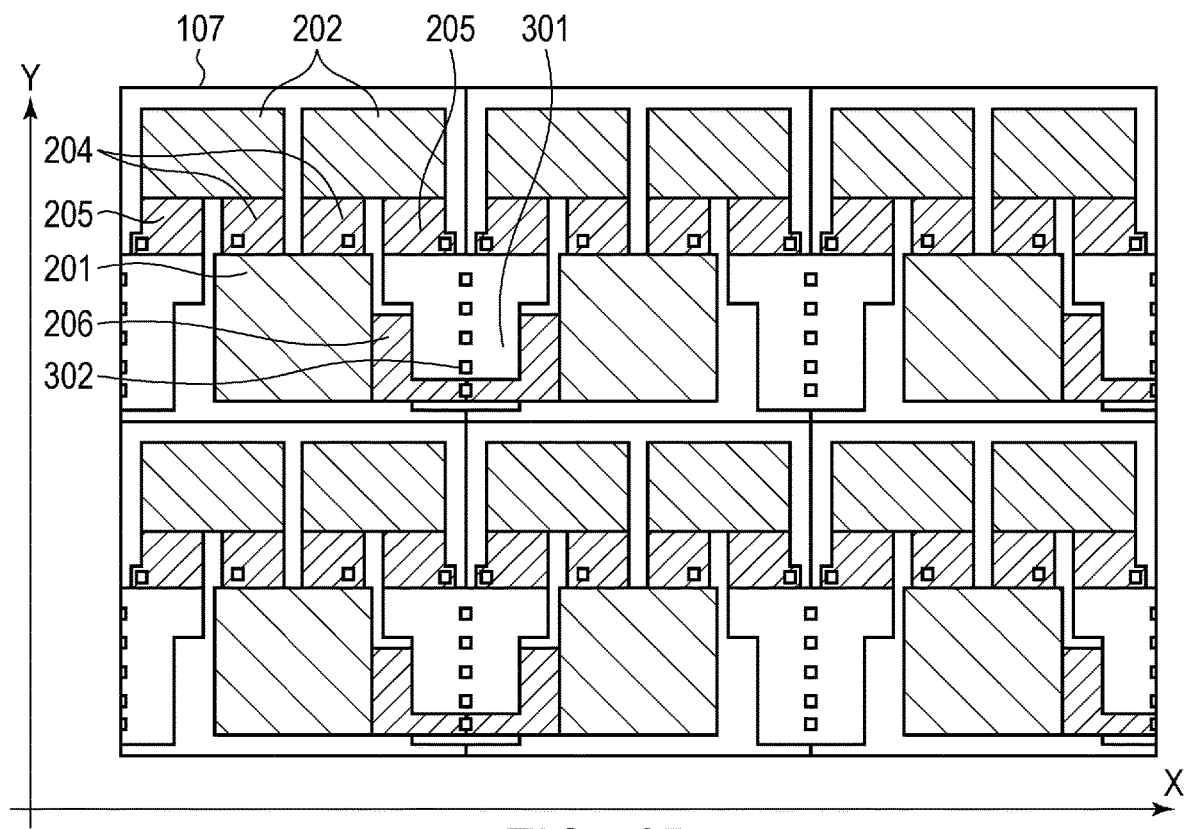
FIG. 6A and FIG. 6B are plan views of pixels in an imaging device according to a second embodiment of the present invention.
Figure 6B:
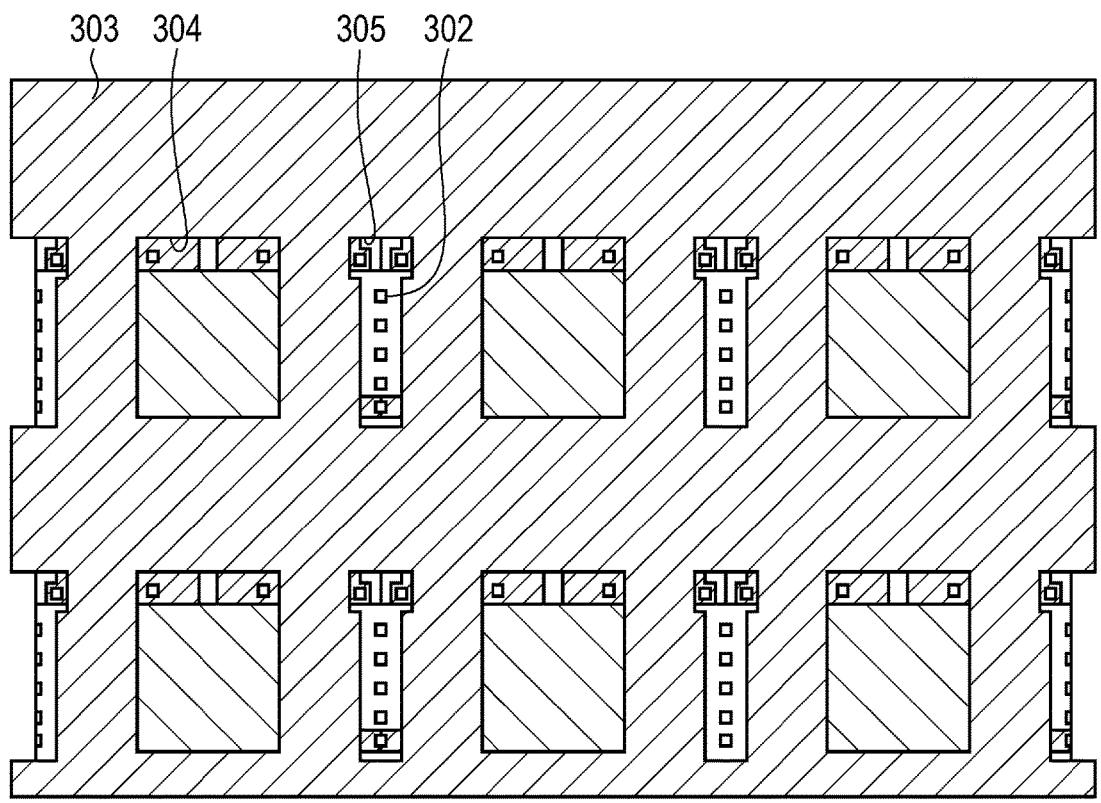

FIG. 6A and FIG. 6B are plan views of the pixels 107 of the imaging device 100 according to a second embodiment. FIG. 6A is a plan view schematically illustrating a pattern near the surface of the semiconductor substrate in a top view from a direction orthogonal to the semiconductor substrate, and FIG. 6B is a plan view mainly, schematically illustrating a pattern of the light-shielding portion 303 formed above the semiconductor substrate. In the description of the present embodiment, the detailed description may be omitted for features common to the first embodiment. Further, in FIG. 6A and FIG. 6B, features having the same function as that in FIG. 3A, FIG. 3B, and the like are labeled with the same reference numeral, and the description of the function thereof may be omitted.

As illustrated in FIG. 6A, the present embodiment is different from the first embodiment in that two first transfer transistors 204, two second transfer transistors 205, and two charge holding units 202 are provided within the pixel 107. The photoelectric conversion unit 201 and readout circuit unit 301 are arranged so as to be aligned in the X-direction interposing the gate electrode of the overflow transistor 206. Further, the photoelectric conversion unit 201 and the two charge holding units 202 are arranged so as to be aligned in the Y-direction, which intersects the X-direction, interposing the gate electrodes of the two different first transfer transistors 204. Further, the two charge holding units 202 are arranged so as to be aligned in the Y-direction interposing the photoelectric conversion unit 201, the readout circuit unit 301, or the like. Further, the two charge holding unit s 202 are arranged so as to be aligned in the X-direction. Since each of other adjacent pixels 107 has the same arrangement, the plurality of charge holding units 202 including adjacent pixels 107 are arranged so as to be aligned in the X-direction. Further, the two charge holding units 202 are connected to the different readout circuit units 301 via the two different second transfer transistors 205. The readout circuit unit 301 is arranged around the boundary of two pixels 107 and shared by two pixels 107. The plurality of contacts 302 are arranged in and near the region in which the readout circuit unit 301 is arranged. More specifically, the plurality of contacts 302 are formed in a region except the region between the plurality of charge holding units 202 aligned in the X-direction.

In FIG. 6B, the light-shielding portion 303 is arranged so as to cover the entire surface of the pixel 107 except the openings 304 provided above the photoelectric conversion units 201 and the openings 305 provided above the readout circuit units 301. Therefore, also in the present embodiment, while the plurality of openings 304 and 305 of the light-shielding portion 303 are arranged in positions where the charge holding units 202 are moved in parallel to the Y-direction, none of the plurality of openings 304 and 305 of the light-shielding portion 303 is arranged in a position where the charge holding units 202 are moved in parallel to the X-direction. In other words, a region between the charge holding units 202 aligned in the X-direction is covered by the light-shielding portion 303 in the top view.

As discussed above, in the present embodiment, modification is made to the first embodiment to increase the number of elements such as the charge holding units 202 or the like included in the pixel 107. Also in such a configuration, the ends of the openings 304 and 305 of the light-shielding portion 303 can be located in a position more distant from each end of the charge holding units 202, which can further improve the light-shielding property of the charge holding units 202. Therefore, similarly to the first embodiment, the imaging device 100 with further reduced deterioration of the image quality due to a false signal caused by a light entering the charge holding unit 202 can be provided also in the present embodiment.

Third Embodiment

Figure 7A:
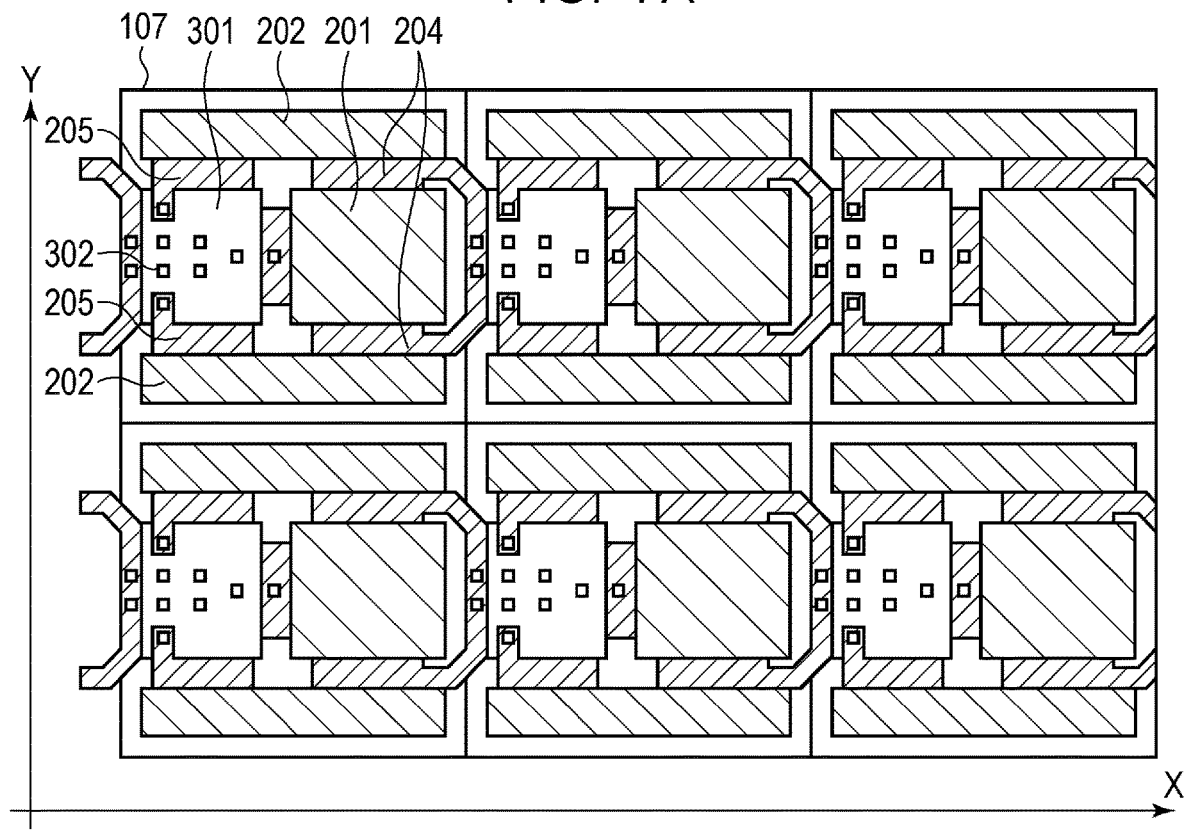
FIG. 7A and FIG. 7B are plan views of pixels in an imaging device according to a third embodiment of the present invention.
Figure 7B:
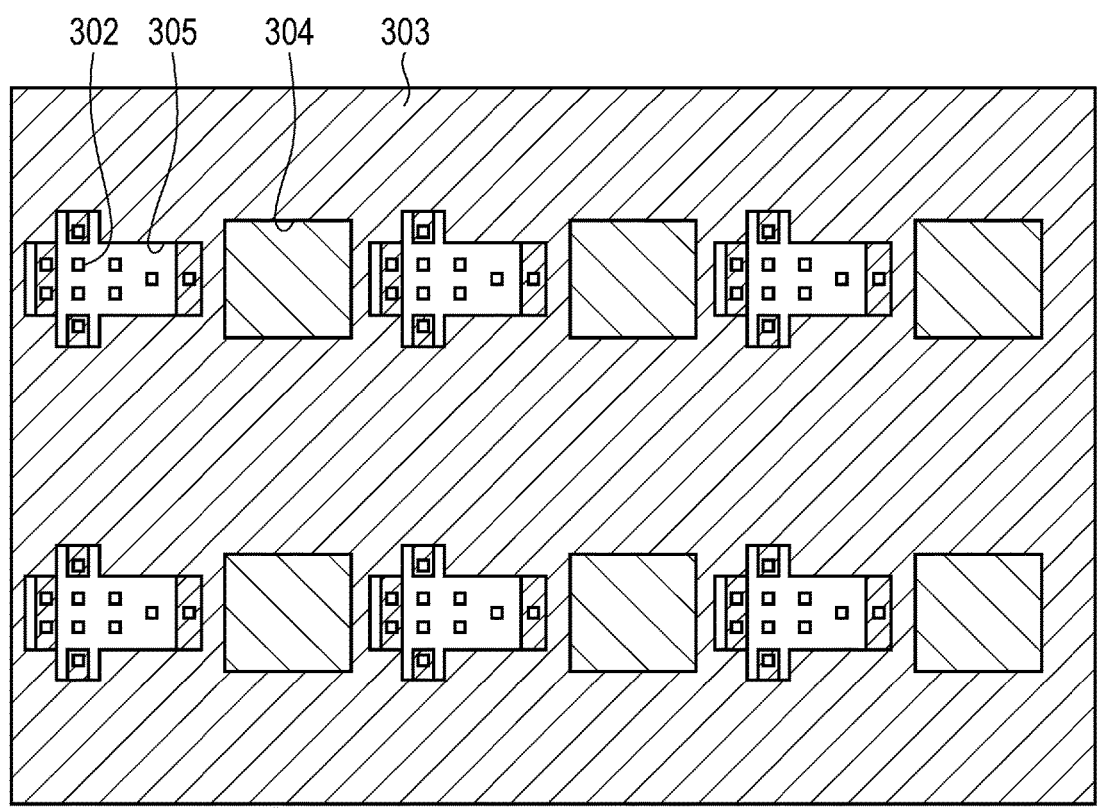

FIG. 7A and FIG. 7B are plan views of pixels 107 of the imaging device 100 according to a third embodiment. FIG. 7A is a plan view schematically illustrating a pattern near the surface of the semiconductor substrate in a top view from a direction orthogonal to the semiconductor substrate, and FIG. 7B is a plan view mainly, schematically illustrating a pattern of the light-shielding portion 303 formed above the semiconductor substrate. In the description of the present embodiment, the detailed description may be omitted for features common to the first embodiment or the second embodiment. Further, in FIG. 7A and FIG. 7B, features having the same function as that in FIG. 3A and FIG. 3B or the like are labeled with the same reference numeral, and the description of the function thereof may be omitted.

As illustrated in FIG. 7A, in the present embodiment, two first transfer transistors 204, two second transfer transistors 205, and two charge holding units 202 are provided within the pixel 107 similarly to the second embodiment. However, the present embodiment is different from the second embodiment in that two charge holding units 202 are arranged to be aligned in the Y-direction interposing the photoelectric conversion unit 201 and the readout circuit unit 301. Furthermore, the present embodiment is different from the second embodiment in that two charge holding units 202 are connected to the same readout circuit unit 301 via the two different second transfer transistors 205.

The photoelectric conversion unit 201 and the readout circuit unit 301 are arranged so as to be aligned in the X-direction interposing the gate electrode of the overflow transistor 206. Further, the photoelectric conversion unit 201 and the two charge holding units 202 are arranged so as to be aligned in the Y-direction, which intersects the X-direction, interposing the gate electrodes of different two first transfer transistors 204. In FIG. 7A, the gate electrodes of two first transfer transistors 204 are formed to be continuous to each other. However, the gate electrodes of two first transfer transistors 204 may be formed to be electrically isolated from each other. Further, two charge holding units 202 are arranged to be aligned in the Y-direction to interpose the photoelectric conversion unit 201 and the readout circuit unit 301. Further, the two charge holding units 202 are connected to the same readout circuit unit 301 via the two different second transfer transistors 205. The plurality of contacts 302 are arranged in and near a region in which the readout circuit unit 301 is arranged. More specifically, the plurality of contacts 302 are formed in a region except the region between the charge holding units 202 aligned in the X-direction.

In FIG. 7B, the light-shielding portion 303 is arranged so as to cover the entire surface of the pixels 107 except the openings 304 provided above the photoelectric conversion units 201 and the openings 305 provided above the readout circuit units 301. Therefore, also in the present embodiment, while the plurality of openings 304 and 305 of the light-shielding portion 303 are arranged in positions where the charge holding units 202 are moved in parallel to the Y-direction, none of the plurality of openings 304 and 305 of the light-shielding portion 303 is arranged in a position where the charge holding units 202 are moved in parallel to the X-direction. In other words, the light-shielding portion 303 is arranged between respective two of the plurality of charge holding units 202 aligned in the X-direction in the top view.

As discussed above, in the present embodiment, modification is made to the first embodiment to increase the number of elements such as the charge holding units 202 or the like included in the pixel 107 by using the different scheme from the second embodiment. Also in such a configuration, the ends of the openings 304 and 305 of the light-shielding portion 303 can be located in a position more distant from each end of the charge holding units 202, which can further improve the light-shielding property of the charge holding units 202. Therefore, similarly to the first embodiment and the second embodiment, the imaging device 100 with further reduced deterioration of the image quality due to a false signal caused by a light entering the charge holding unit 202 can be provided also in the present embodiment.

Fourth Embodiment

Figure 8A:
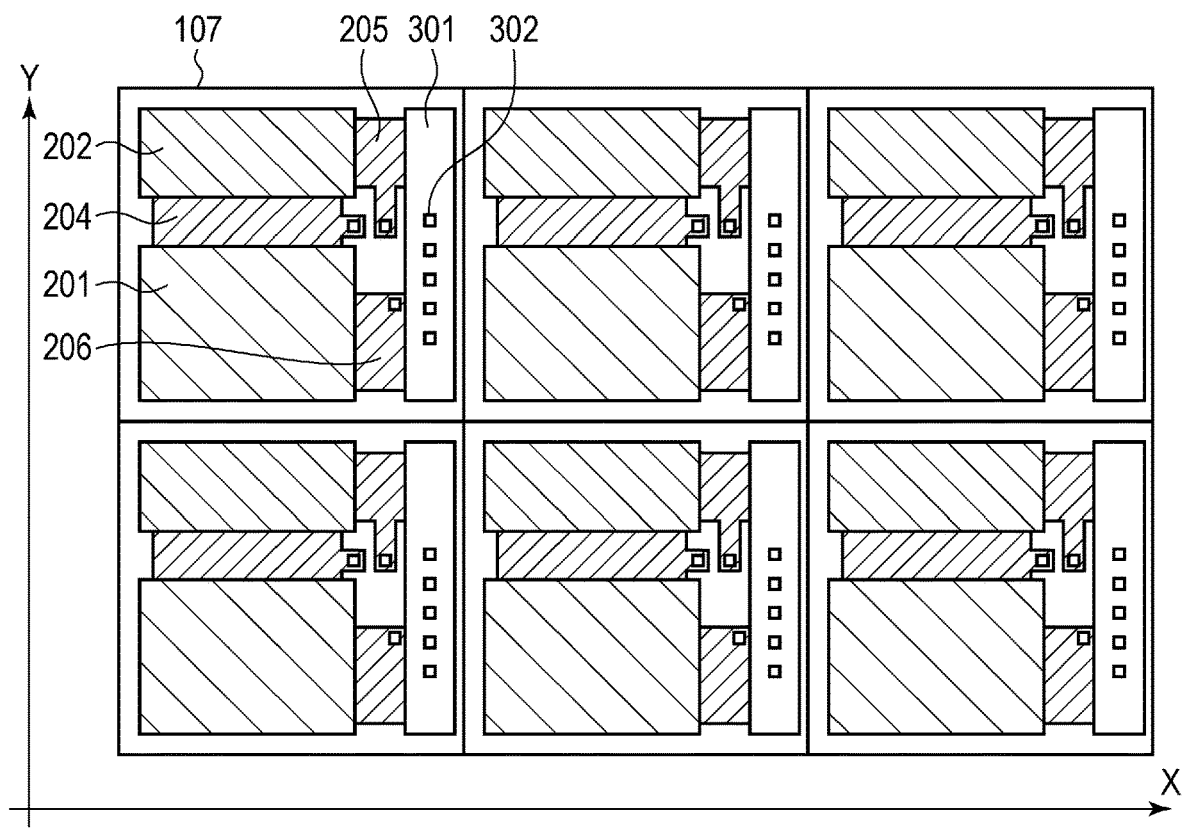
FIG. 8A and FIG. 8B are plan views of pixels in an imaging device according to a fourth embodiment of the present invention.
Figure 8B:
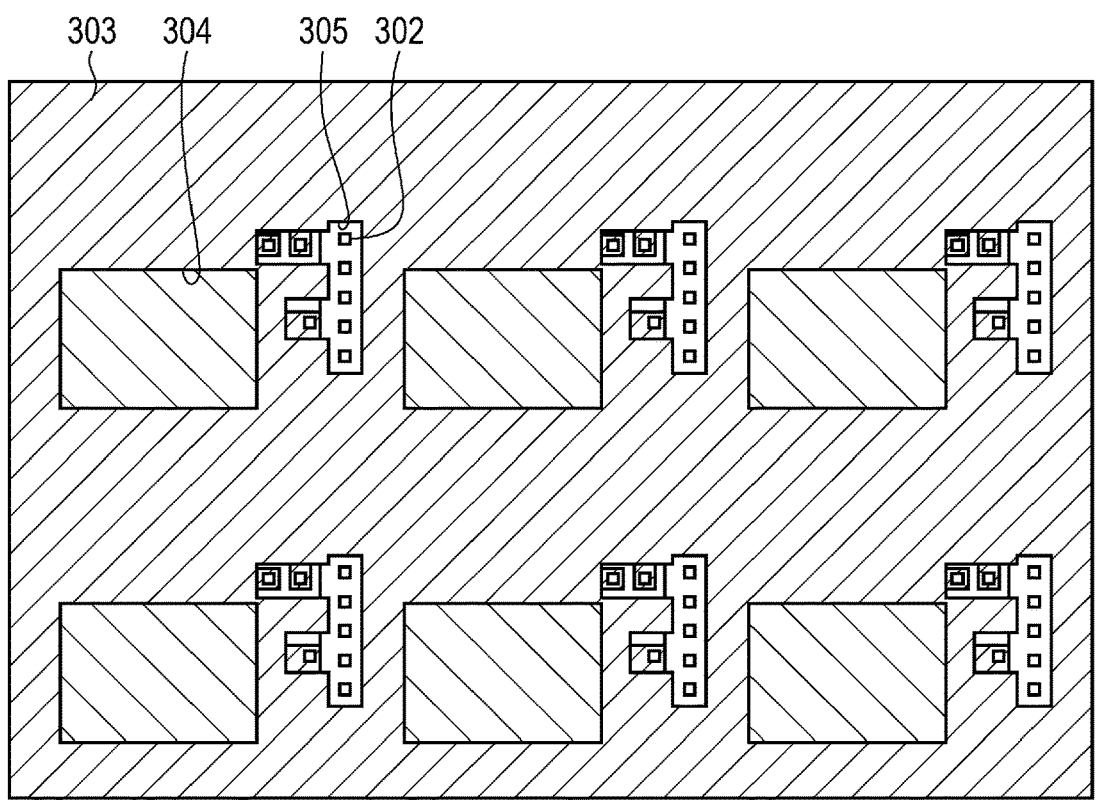

FIG. 8A and FIG. 8B are plan views of pixels 107 of the imaging device 100 according to a fourth embodiment. FIG. 8A is a plan view schematically illustrating a pattern near the surface of the semiconductor substrate in a top view from a direction orthogonal to the semiconductor substrate, and FIG. 8B is a plan view mainly, schematically illustrating a pattern of the light-shielding portion 303 formed above the semiconductor substrate. In the description of the present embodiment, the detailed description may be omitted for features common to the first to third embodiments. Further, in FIG. 8A and FIG. 8B, features having the same function as that in FIG. 3A and FIG. 3B or the like are labeled with the same reference numeral, and the description of the function thereof may be omitted.

As illustrated in FIG. 8A, the present embodiment is different from the first embodiment in the arrangement of the charge holding unit 202, the second transfer transistor 205, the readout circuit unit 301, and the like. The photoelectric conversion unit 201 and the readout circuit unit 301 are arranged so as to be aligned in the X-direction interposing the gate electrode of the overflow transistor 206. Further, the photoelectric conversion unit 201 and the charge holding unit 202 are arranged so as to be aligned in the Y-direction interposing the gate electrode of the first transfer transistors 204. Further, the charge holding unit 202 and the readout circuit unit 301 are arranged so as to be aligned in the X-direction interposing the gate electrode of the second transfer transistor 205. The plurality of contacts 302 are arranged in and near the region in which the readout circuit unit 301 is arranged. More specifically, the plurality of contacts 302 are formed in a region except the region between the plurality of charge holding units 202 aligned in the X-direction.

In FIG. 8B, the light-shielding portion 303 is arranged so as to cover the entire surface of the pixels 107 except the openings 304 provided above the photoelectric conversion units 201 and the openings 305 provided above the readout circuit units 301. Therefore, also in the present embodiment, while the plurality of openings 304 and 305 of the light-shielding portion 303 are arranged in positions where the charge holding units 202 are moved in parallel to the Y-direction, none of the plurality of openings 304 and 305 of the light-shielding portion 303 is arranged in a position where the charge holding units 202 are moved in parallel to the X-direction. In other words, the light-shielding portion 303 is arranged between respective two of the plurality of charge holding units 202 aligned in the X-direction in the top view.

As discussed above, in the present embodiment, modification is made to the first embodiment to change the arrangement of the charge holding unit 202, the second transfer transistor 205, the readout circuit unit 301, and the like. Specifically, the gate electrode of the second transfer transistor 205 and the readout circuit unit 301 are arranged in a region between the charge holding units 202 of the adjacent pixels aligned in the X-direction. Since the openings 304 and 305 are not provided between the charge holding units 202, however, the light-shielding property of the charge holding units 202 can be improved for the same reason as in the first embodiment. Therefore, similarly to the first embodiment, the imaging device 100 with further reduced deterioration of the image quality due to a false signal caused by a light entering the charge holding unit 202 can be provided also in the present embodiment.

Fifth Embodiment

Figure 9:
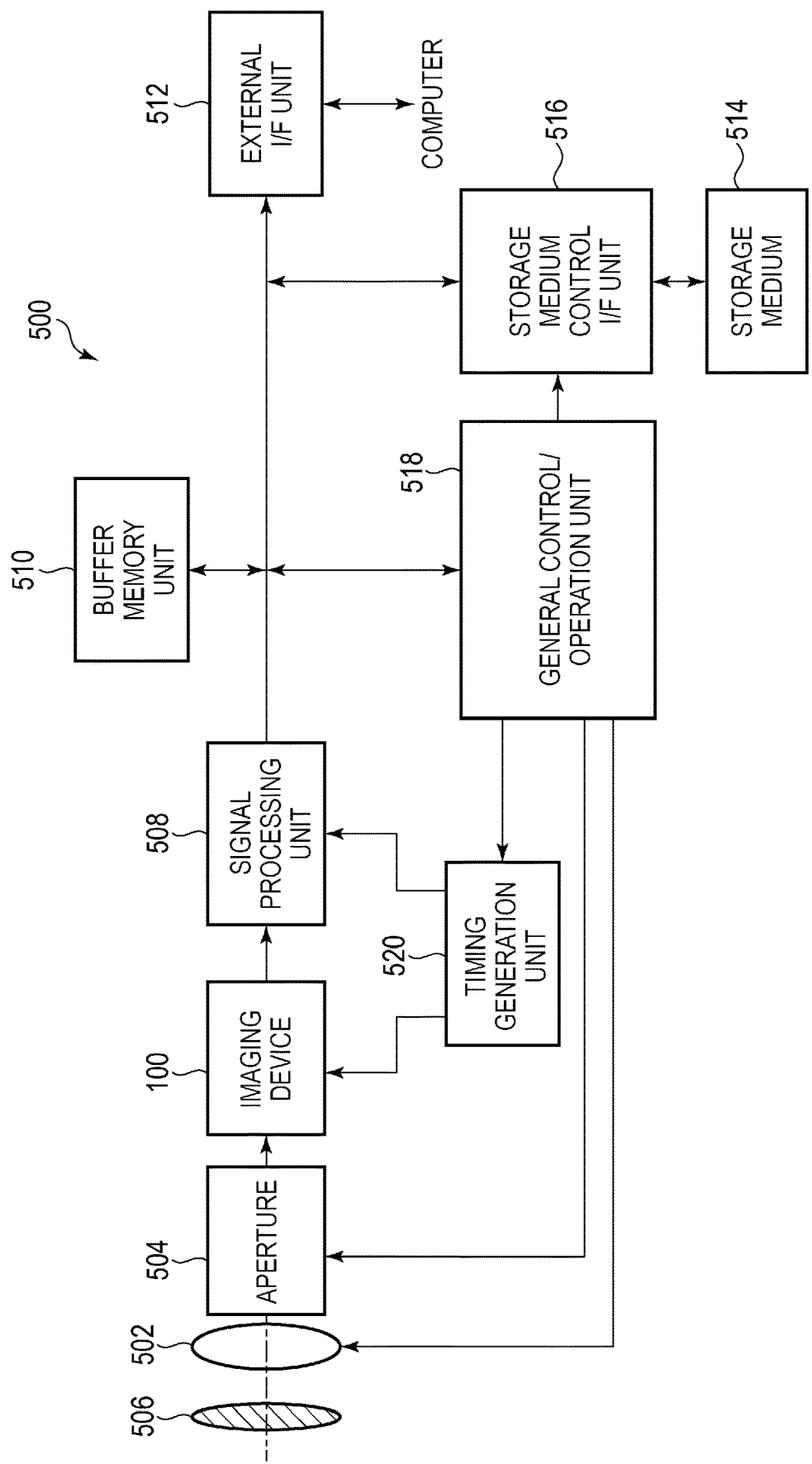
FIG. 9 is a block diagram of an imaging system according to a fifth embodiment of the present invention.

FIG. 9 is a block diagram illustrating the configuration of an imaging system 500 according to the present embodiment. The imaging device 100 described in the above first to fourth embodiments can be applied to the imaging system 500. The imaging system 500 to which the imaging device 100 can be applied may include a digital still camera, a digital camcorder, a surveillance camera, or the like, for example. FIG. 9 illustrates an example configuration of a digital still camera to which the imaging device 100 described in the above embodiments is applied.

The imaging system 500 illustrated in FIG. 9 as an example has an imaging device 100, a lens 502 that captures an optical image of a subject onto the imaging device 100, an aperture 504 for changing a light amount passing through the lens 502, and a barrier 506 for protecting the lens 502. The lens 502 and the aperture 504 form an optical system that converges a light onto the imaging device 100. The imaging device 100 is any of the imaging devices 100 described in the first to fourth embodiments.

The imaging system 500 further has a signal processing unit 508 that processes an output signal output from the imaging device 100. The signal processing unit 508 performs the operation of signal processing of performing various correction or compression on an input signal if necessary and outputting the signal. The signal processing unit 508 may have a function for performing an AD conversion process on an output signal output from the imaging device 100. In this case, the imaging device 100 is not necessarily required to have an AD conversion circuit therein.

The imaging system 500 further has a buffer memory unit 510 for temporarily storing image data therein and an external interface unit (external I/F unit) 512 for communicating with an external computer or the like. The imaging system 500 further has a storage medium 514 such as a semiconductor memory for performing storage or readout of image pickup data and a storage medium control interface unit (storage medium control I/F unit) 516 for performing storage or readout on the storage medium 514. Note that the storage medium 514 may be embedded in the imaging system 500 or may be removable.

The imaging system 500 further has a general control/operation unit 518 that performs various computation and controls the entire digital still camera and a timing generation unit 520 that outputs various timing signals to the imaging device 100 and the signal processing unit 508. Here, the timing signal or the like may be input from the outside, and the imaging system 500 may have at least the imaging device 100 and the signal processing unit 508 that processes an output signal output from the imaging device 100. The general control/operation unit 518 and the timing generation unit 520 may be configured to implement a part of or all of the functions of the control circuit 106 or the like of the imaging device 100.

The imaging device 100 outputs an image forming signal to the signal processing unit 508. The signal processing unit 508 performs predetermined signal processing on an image forming signal output from the imaging device 100 and outputs image data. Further, the signal processing unit 508 uses an image forming signal to generate an image.

The imaging device 100 of any of the first to fourth embodiments is used to form an imaging system, and thereby an imaging system that can acquire a higher quality image can be realized.

Sixth Embodiment

Figure 10A:
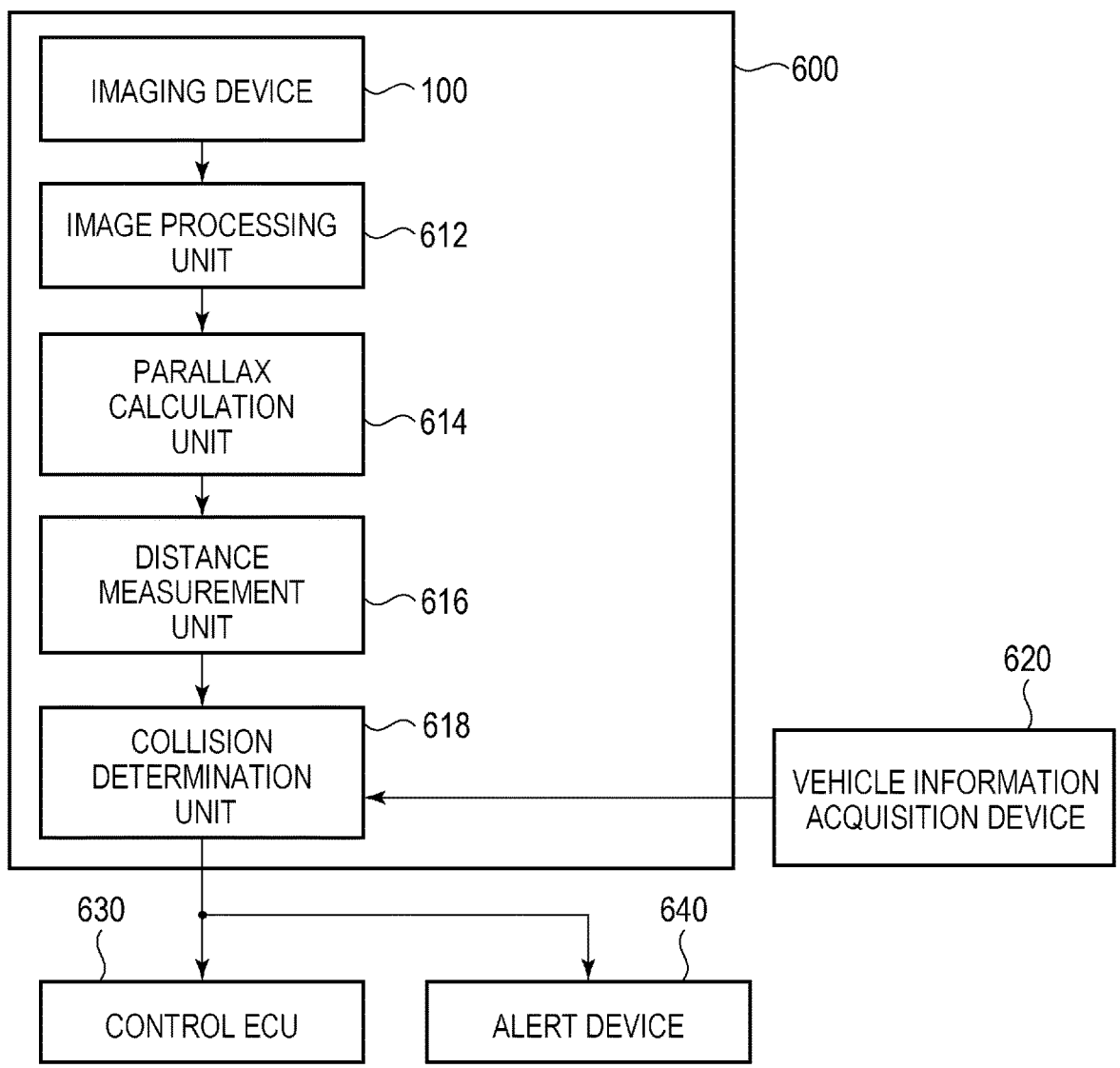
FIG. 10A and FIG. 10B are block diagrams of an imaging system and a mobile apparatus according to a sixth embodiment of the present embodiment.
Figure 10B:
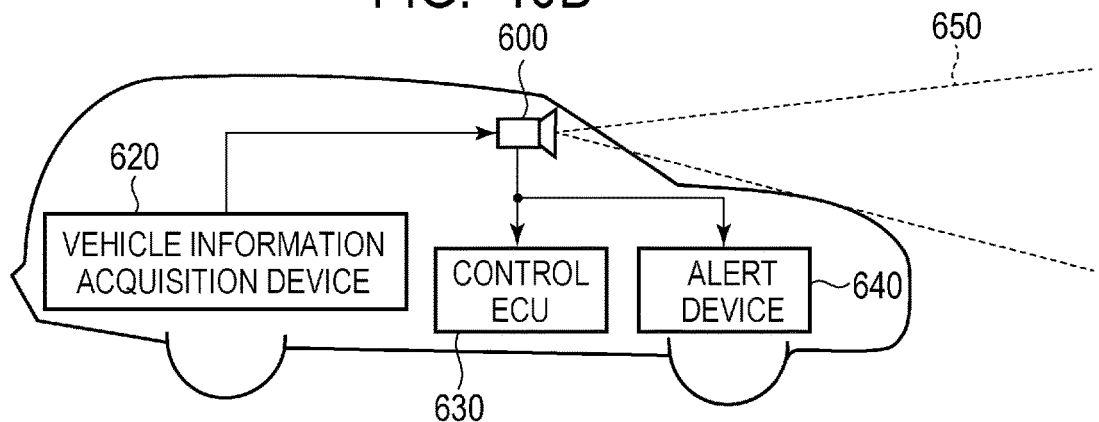

FIG. 10A and FIG. 10B are diagrams of the configuration of an imaging system 600 and a mobile apparatus according to the present embodiment. FIG. 10A illustrates an example of the imaging system 600 related to an on-vehicle camera. The imaging system 600 has the imaging device 100. The imaging device 100 is any of the imaging devices 100 described in the above first to fourth embodiments. The imaging system 600 has an image processing unit 612 that performs image processing on a plurality of image data acquired by the imaging device 100 and a parallax calculation unit 614 that calculates a parallax (a phase difference of parallax images) from the plurality of image data acquired by the imaging system 600. Further, the imaging system 600 has a distance measurement unit 616 that calculates a distance to the object based on the calculated parallax and a collision determination unit 618 that determines whether or not there is a collision probability based on the calculated distance. Here, the parallax calculation unit 614 and the distance measurement unit 616 are an example of a distance information acquisition unit that acquires distance information to the object. That is, the distance information is information regarding a parallax, a defocus amount, a distance to an object, or the like. The collision determination unit 618 may use any of the distance information to determine the collision probability. The distance information acquisition unit may be implemented by dedicatedly designed hardware or may be implemented by a software module. Further, the distance information acquisition unit may be implemented by a Field Programmable Gate Array (FPGA), an Application Specific Integrated Circuit (ASIC), or the like, or may be implemented by combination thereof.

The imaging system 600 is connected to the vehicle information acquisition device 620 and can acquire vehicle information such as a vehicle speed, a yaw rate, a steering angle, or the like. Further, the imaging system 600 is connected with a control ECU 630, which is a control device that outputs a control signal for causing a vehicle to generate braking force based on a determination result by the collision determination unit 618. That is, the control ECU 630 is an example of a mobile apparatus control unit that controls a mobile apparatus based on distance information. Further, the imaging system 600 is connected with an alert device 640 that issues an alert to the driver based on a determination result by the collision determination unit 618. For example, when the collision probability is high as the determination result of the collision determination unit 618, the control ECU 630 performs vehicle control to avoid a collision or reduce damage by applying brake, pushing back an accelerator, suppressing engine power, or the like. The alert device 640 alerts a user by sounding an alert such as a sound, displaying alert information on a display of a car navigation system or the like, providing vibration to seat belt or a steering wheel, or the like.

In the present embodiment, the imaging system 600 captures an image of a surrounding area such as a front area or a rear area, for example, of a vehicle. FIG. 10B illustrates the imaging system 600 in a case of capturing a front area of a vehicle (a capturing area 650). The vehicle information acquisition device 620 transmits instructions to operate the imaging system 600 and perform capturing. A use of the imaging device 100 according to any of the first to fourth embodiments allows the imaging system 600 of the present embodiment to further improve the ranging accuracy.

Although the example of control for avoiding a collision to another vehicle has been illustrated in the above description, the embodiment is applicable to automatic driving control for following another vehicle, automatic driving control for not going out of a traffic lane, or the like. Furthermore, the imaging system is not limited to a vehicle such as the subject vehicle, and can be applied to a mobile apparatus (moving apparatus) such as a ship, an airplane, or an industrial robot, for example. In addition, the imaging system can be widely applied to a device which utilizes object recognition, such as an intelligent transportation system (ITS), without being limited to mobile apparatuses.

Other Embodiments

Note that any of the embodiments described above has been provided to merely illustrate an example of embodiment in implementing the present invention, and the technical scope of the present invention is not to be construed in a limiting sense by these embodiments. That is, the present invention can be implemented in various forms without departing from the technical concept thereof or the primary features thereof. For example, it should be appreciated that an embodiment in which a part of the configuration of any of the embodiments is added to another embodiment or replaced with a part of the configuration of another embodiment is considered to be an embodiment to which the present invention may be applied.

Embodiments of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-232726, filed Nov. 30, 2016, which is hereby incorporated by reference herein in its entirety.

What is claimed is:

1. An imaging device comprising:
a substrate;
a pixel array in which a plurality of pixels are arranged in a two-dimensional manner on the substrate, wherein each of the pixels includes a photoelectric conversion unit configured to accumulate charges generated from an incident light, a charge holding unit configured to hold the charges transferred from the photoelectric conversion unit, and an amplification unit having an input node that receives the charges transferred from the charge holding unit; and
a light-shielding portion arranged to cover at least the charge holding unit,
wherein the photoelectric conversion unit and the charge holding unit included in one of the pixels are aligned in a first direction in a top view from a direction orthogonal to the substrate,
wherein a plurality of the charge holding units of the plurality of the pixels that are adjacent to each other are aligned in a second direction intersecting the first direction in the top view, and
wherein the light-shielding portion extends in the second direction and over the plurality of the charge holding units, and covers a region between the plurality of the charge holding units,
wherein each of the pixels further includes a plurality of contacts that connect electrodes provided to the substrate and a wiring layer formed above the substrate,
wherein the plurality of contacts are formed in a region between the plurality of the charge holding units aligned in the first direction in the top view, and
wherein the light-shielding portion includes a part extending in the first direction and provided between the photoelectric conversion unit and the plurality of contacts.

2. The imaging device according to claim 1, wherein the wiring layer is arranged to cover the charge holding unit.

3. The imaging device according to claim 1, wherein the light-shielding portion has first openings each formed in a region in which the photoelectric conversion unit is formed and second openings each formed in a region in which the plurality of contacts are formed in the top view.

4. The imaging device according to claim 3, wherein the plurality of contacts included in one of the pixels are aggregated under corresponding one of the second openings.

5. The imaging device according to claim 1,
wherein an element isolation region that electrically isolate the photoelectric conversion unit and the charge holding unit from each other is arranged in the pixel array, and
wherein the element isolation region is formed of a material that restricts a light entering the charge holding unit.

6. The imaging device according to claim 5, wherein the element isolation region is an impurity diffusion region forming PN junction isolation.

7. The imaging device according to claim 1, wherein the pixel array is shaped in a rectangle having longer sides and shorter sides, and
wherein the second direction is parallel to the longer sides.

8. The imaging device according to claim 1, wherein each of the pixels includes a plurality of the charge holding units, and
wherein the plurality of the charge holding units are arranged to be aligned in the second direction in the top view.

9. The imaging device according to claim 1, wherein each of the pixels includes a plurality of the charge holding units, and
wherein the plurality of the charge holding units are arranged to be aligned in the first direction interposing the photoelectric conversion unit in the top view.

10. The imaging device according to claim 1, wherein a readout circuit unit configured to read out charges generated in the photoelectric conversion unit as an electrical signal is arranged in a region between the plurality of the photoelectric conversion units aligned in the second direction in the top view.

11. The imaging device according to claim 1, wherein the light-shielding portion is continuous from one end of the pixel array to another end of the pixel array to cover a plurality of the charge holding units that form a column in the second direction.

12. The imaging device according to claim 1,
wherein each of the pixels further includes a transistor comprising a gate electrode and transferring charges from the photoelectric conversion unit to the charge holding unit, and
wherein a gap of two of the charge holding units of the plurality of the charge holding units that are adjacent to each other in the top view is smaller than a width of the gate electrode of the transistor.

13. An imaging system comprising:
the imaging device according to claim 1; and
a signal processing unit configured to process a signal output from the pixels of the imaging device.

14. A mobile apparatus comprising:
the imaging device according to claim 1;
a distance information acquisition unit configured to acquire distance information of a distance to an object from parallax images based on a signal from the imaging device; and
a mobile apparatus control unit configured to control the mobile apparatus based on the distance information.

15. An imaging device comprising:
a substrate;
a pixel array in which a plurality of pixels are arranged in a two-dimensional manner on the substrate, wherein each of the pixels includes a photoelectric conversion unit configured to accumulate charges generated from an incident light, a charge holding unit configured to hold the charges transferred from the photoelectric conversion unit, and an amplification unit having an input node that receives the charges transferred from the charge holding unit; and
a light-shielding portion arranged to cover at least the charge holding unit,
wherein the photoelectric conversion unit and the charge holding unit included in one of the pixels are aligned in a first direction in a top view from a direction orthogonal to the substrate,
wherein a plurality of the charge holding units of the plurality of the pixels that are adjacent to each other are aligned in a second direction intersecting the first direction in the top view,
wherein the light-shielding portion extends in the second direction and over the plurality of the charge holding units, and covers a region between the plurality of the charge holding units,
wherein an element isolation region that electrically isolate the photoelectric conversion unit and the charge holding unit from each other is arranged in the pixel array,
wherein the element isolation region is formed of a material that restricts a light entering the charge holding unit, and
wherein the element isolation region is an impurity diffusion region forming PN junction isolation.

16. The imaging device according to claim 15,
wherein each of the pixels further includes a plurality of contacts that connect electrodes provided to the substrate and a wiring layer formed above the substrate,
wherein the plurality of contacts are formed in a region between the plurality of the charge holding units aligned in the first direction in the top view, and
wherein the light-shielding portion includes a part extending in the first direction and provided between the photoelectric conversion unit and the plurality of contacts.

17. The imaging device according to claim 15, wherein the light-shielding portion has first openings each formed in a region in which the photoelectric conversion unit is formed and second openings each formed in a region in which the plurality of contacts are formed in the top view.

18. The imaging device according to claim 17, wherein the plurality of contacts included in one of the pixels are aggregated under corresponding one of the second openings.

19. The imaging device according to claim 15, wherein the pixel array is shaped in a rectangle having longer sides and shorter sides, and
wherein the second direction is parallel to the longer sides.

* * * * *